United States Patent
Letterman, Jr. et al.

(10) Patent No.: US 8,319,323 B2
(45) Date of Patent: Nov. 27, 2012

(54) ELECTRONIC PACKAGE HAVING DOWN-SET LEADS AND METHOD

(75) Inventors: James P. Letterman, Jr., Mesa, AZ (US); Joseph K. Fauty, Mesa, AZ (US); Jay A. Yoder, Phoenix, AZ (US); William F. Burghout, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 891 days.

(21) Appl. No.: 11/575,204

(22) PCT Filed: Dec. 20, 2004

(86) PCT No.: PCT/US2004/043075
§ 371 (c)(1),
(2), (4) Date: Sep. 22, 2009

(87) PCT Pub. No.: WO2006/068641
PCT Pub. Date: Jun. 29, 2006

(65) Prior Publication Data
US 2010/0000772 A1    Jan. 7, 2010

(51) Int. Cl.
*H01L 23/48*    (2006.01)
(52) U.S. Cl. ........ 257/678; 257/690; 257/666; 257/696; 257/692; 174/260; 438/106; 438/123

(58) Field of Classification Search .......... 174/250–252, 174/260, 521; 257/666, 672, 675, 676, 789, 257/678–733; 438/106, 112, 123
See application file for complete search history.

(56) References Cited

U.S. PATENT DOCUMENTS

| | | | | |
|---|---|---|---|---|
| 5,801,432 A | * | 9/1998 | Rostoker et al. | 257/666 |
| 6,552,421 B2 | * | 4/2003 | Kishimoto et al. | 257/678 |
| 6,802,119 B2 | * | 10/2004 | Dunford | 29/840 |
| 7,166,919 B2 | * | 1/2007 | Tabira | 257/730 |
| 7,224,045 B2 | * | 5/2007 | Tabira et al. | 257/666 |
| 7,317,243 B2 | * | 1/2008 | Wang | 257/668 |
| 7,709,935 B2 | * | 5/2010 | Islam et al. | 257/666 |
| 2002/0106903 A1 | * | 8/2002 | Kurita et al. | 438/707 |
| 2002/0113301 A1 | * | 8/2002 | Tai | 257/678 |
| 2003/0071335 A1 | * | 4/2003 | Jeung et al. | 257/678 |
| 2004/0108580 A1 | * | 6/2004 | Tan et al. | 257/678 |
| 2005/0133896 A1 | * | 6/2005 | Liu et al. | 257/678 |

\* cited by examiner

*Primary Examiner* — Angel R Estrada
*Assistant Examiner* — Dimary Lopez
(74) *Attorney, Agent, or Firm* — Kevin B. Jackson

(57) ABSTRACT

In one embodiment, a leadless package includes down-set conductive leads having base portions. The base portions include stand-offs that attach to electrodes on an electronic chip using, for example, a solder die attach material. An optional encapsulating layer covers portions of the down-set conductive leads and portions of the electronic chip while leaving pad portions of the down-set conductive leads and a surface of the electronic chip exposed. The pad portions and the surface of the electronic chip are oriented to attach to a next level of assembly.

21 Claims, 7 Drawing Sheets

ELECTRONIC PACKAGE HAVING DOWN-SET LEADS AND METHOD

BACKGROUND OF THE INVENTION

This invention relates generally to electronic devices, and more specifically to thin profile and small footprint packages and methods of assembly.

The handheld consumer products market is aggressive in the miniaturization of portable electronics. Driven primarily by the cellular phone and digital assistant markets, manufacturers of these devices are challenged by ever shrinking formats and the demand for more PC-like functionality. This challenge asserts pressure on surface mount component manufacturers to design their products to command the smallest area possible. By doing so, this allows portable electronics designers to incorporate additional functions within a device without increasing the overall product size. Leadless packages having one or more exposed integrated circuit terminations are one type of package structure that provides semiconductor manufacturers with an ability to significantly reduce the size of a surface mounted device. Such packages include Quad Flat Non-leaded (QFN) style designs with exposed terminations as well as the DirectFET™ package by International Rectifier Corporation.

Several manufacturing problems exist with current surface mount type packages with exposed terminations. For example, during solder attach and/or solder reflow steps, the semiconductor die tends to move, thus affecting the overall orientation of bonding areas (e.g., source, emitter, gate, or base electrode bonding areas). This detrimentally impacts the alignment of the surface mount device when it is attached to a printed circuit board or a next level of assembly.

Additionally, typical surface mount package manufacturing methods utilize single cavity molding processes. Such processes use mold cavities with mold compound runners and gate regions, which tend to waste mold compound material during manufacturing. Also, single cavity molding processes require manufactures to use lead frames with excess lead frame material, which is later removed and discarded as waste. Such waste materials increase manufacturing costs and can be a detriment to the environment.

U.S. Patent Application Publication 2004/0108580 dated Jun. 10, 2004 by applicants Kim Hwee Tan et al., describes a package structure that uses a single flip chip solder bumped semiconductor connected to a recessed lead frame. Tan further describes a fully encapsulated structure as well as a version with an exposed die back side for thermal enhancement. Tan uses a grinding process to remove encapsulating material to provide the exposed die back side. One disadvantage of Tan's structure is that it uses a flip-chip interconnect scheme. Such schemes require under bump metallurgy (UBM) and solder bump plating processes, which add to chip manufacturing costs. UBM refers to the layers of metallization that provide an interface between bond pads located on the chips and the solder bump, and typically consists of three separate layers. In addition, the solder bumps can cause stress issues with the chip and/or package structure, which can lead to quality and reliability issues. Additionally, Tan's grinding process can damage the semiconductor chip and/or the package, which can also lead to quality and reliability issues.

Accordingly, a need exists for an improved electronic package structure and method that addresses, among other things, die alignment issues, and that reduces materials waste. Additionally, it would be advantageous to have a structure and method that supports multiple chip layout designs, flexible interconnect or routing schemes, and chips with solderable, bumpless, or non-flip chip top metal structures.

DETAILED DESCRIPTION OF THE DRAWINGS

Figure 1A:
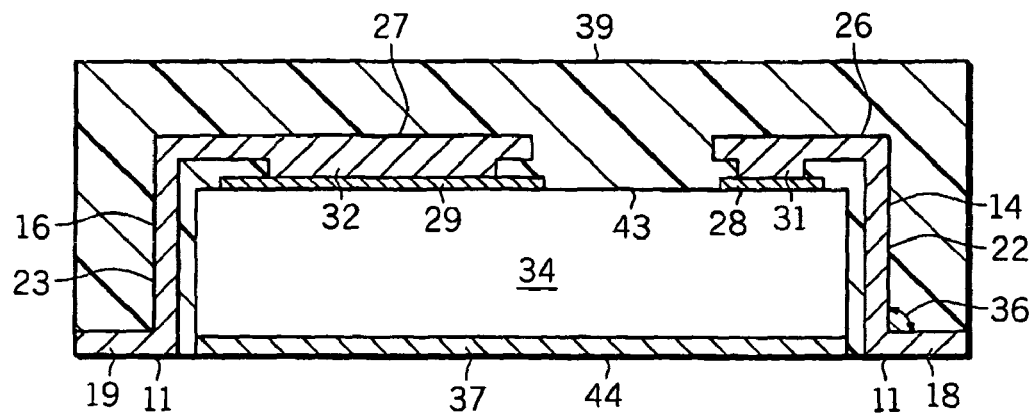
FIG. 1A illustrates a cross-sectional view of a package structure in accordance with the present invention.

For ease of understanding, elements in the drawing figures are not necessarily drawn to scale, and like element numbers are used where appropriate throughout the various figures. Although the invention is described using a QFN embodiment with an exposed termination, those skilled in the art will recognize that the present invention is applicable to other types of packages as well.

FIG. 1A shows a cross-sectional view of a package structure, leadless package structure, down-set package device, or a QFN package structure 10 in accordance with an embodiment of the present invention. Package 10 includes a lead frame, down-set lead frame or conductive substrate 11, which is stamped and shaped, for example, from a sheet of metal such as copper. Alternatively, lead frame 11 comprises a copper alloy (e.g., TOMAC 4, TAMAC 5, 2ZFROFC, or CDA194), a copper plated iron/nickel alloy (e.g., copper plated Alloy 42), plated aluminum, plated plastic, or the like. Plated materials include copper, silver, multi-layer plating such nickel-palladium and gold. In one exemplary embodiment, lead frame 11 is formed of copper with a thickness between about fifteen to about fifty (15-50) microns.

Lead frame 11 further includes recessed or down-set portions or conductive leads 14 and 16. Down-set leads 14 and 16 include foot or pad portions 18 and 19 respectively, which are used to connect package 10 to a printed circuit board or next level of assembly. Down-set leads 14 and 16 further include middle, connecting, or leg portions 22 and 23 respectively, and support, top, base, or chip connect portions 26 and 27 respectively. Foot portion 18 forms an angle 36 with middle portion 22. In an exemplary embodiment, angle 36 is about 90 degrees. Alternatively 36 is greater than or less than 90 degrees. In an exemplary embodiment, foot portion 19 has as a similar orientation with leg portion 23. Base portions 26 and 27 include projections, raised pedestal, stand-offs, chip attach portions, connective devices, or posts 31 and 32 respectively. Stand-offs 31 and 32 are used to couple, connect, or bond to an electronic or semiconductor chip 34, and are formed using, for example, conventional masking and etching techniques. Other processes to form stand-offs 31 and 32 include stud bumping, plating, and stamping to form dimpled features. Additionally, wire bond ball formation and wire trim is used to form stand-offs 31 and 32.

Semiconductor chip 34 comprises, for example, a power MOSFET device, a bipolar transistor, an insulated gate bipolar transistor, a thyristor, a diode, an analog or digital integrated circuit, a sensor, a passive component, or another electronic device. Semiconductor chip 34 includes a first bonding surface 43 and a second bonding surface or termination 44 opposite first bonding surface 43. In the embodiment shown, semiconductor chip 34 is a power transistor including a control electrode or contact 28, and a first or major current carrying electrode or contact 29 formed on first bonding surface 43. Stand-offs 31 and 32 each have an attachment area that corresponds to the areas of contacts 28 and 29, and thus stand-offs 31 and 32 may have different sizes or surface areas or shapes in order to mate or connect appropriately with contacts 28 and 29.

In a preferred embodiment, contacts 28 and 29 comprise a solderable metal such as TiNiAg, CrNiAu, or the like. Contacts 28 and 29 are attached to stand-offs 31 and 32 using a solder die attach and/or conductive epoxy die attach materials. According to the present invention, stand-offs 31 and 32 provide a smaller or more optimum contact area compared to prior art structures that have flat and larger contact areas, and provide a self-centering effect. This reduces the rotation of semiconductor chip 34 during the chip attach process, and thus reduces misalignment problems.

Semiconductor chip 34 further includes a second current carrying electrode 37, which in this embodiment is formed on another, a back or lower side of semiconductor chip 34. In package 10, current carrying electrode 37 is an exposed termination suitable to bond or attach directly to a bonding pad on a next level assembly. In a preferred embodiment, current carrying electrode 37 includes a layer of solderable metal such TiNiAg, CrNiAu, or the like for attaching to the next level of assembly with solder or another die attach layer.

Package 10 further includes an optional molded encapsulating layer or protective layer 39, which covers at least a portion of semiconductor chip 34 and portions of down-set conductive leads 14 and 16. In the embodiment shown, foot portions 18 and 19 have surfaces that are exposed to couple or connect to a next level of assembly. This is accomplished, for example, by placing current carrying electrode 37 and foot portions 18 and 19 of lead frame 11 against a surface of a mold cavity during the molding process to prevent mold compound from covering these surfaces. This is preferred over a grinding process because it eliminates an additional process step, and also eliminates the reliability problems associated with it.

Encapsulating layer 39 comprises, for example, an epoxy resin mold compound such as G770 mold compound, available from Sumitomo Plastics America of Santa Clara, Calif. Alternatively, encapsulating layer 39 comprises an enhanced thermal conductivity mold compound such as a CEL 9000 series mold compound available from Hitachi Chemical of Santa Clara, Calif.

Figure 1B:
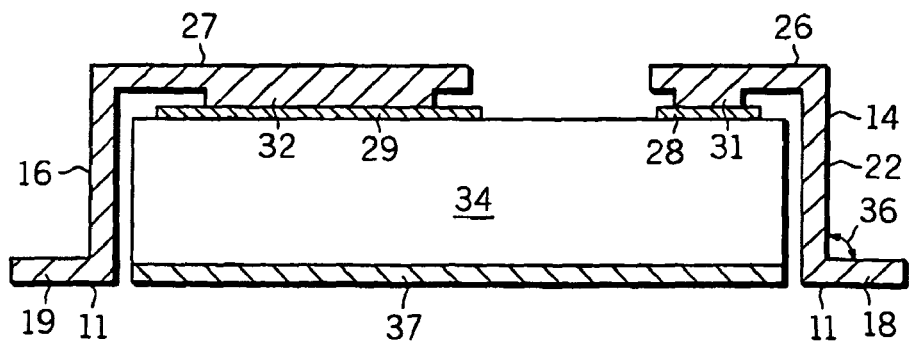
FIG. 1B illustrates a cross-sectional view of a package structure in accordance with another embodiment of the present invention.

FIG. 1B shows a cross-sectional view of a down-set package structure 20 according to another embodiment of the present invention. Package structure 20 is similar to package structure 10 except that encapsulating layer 39 is not used. Package 20 is suitable for very light weight and thin profile applications. After package 20 is attached to a next level of assembly, a conformal passivating coating (e.g., an epoxy or urethane coating) may be applied over the package for additional protection.

Figure 2:
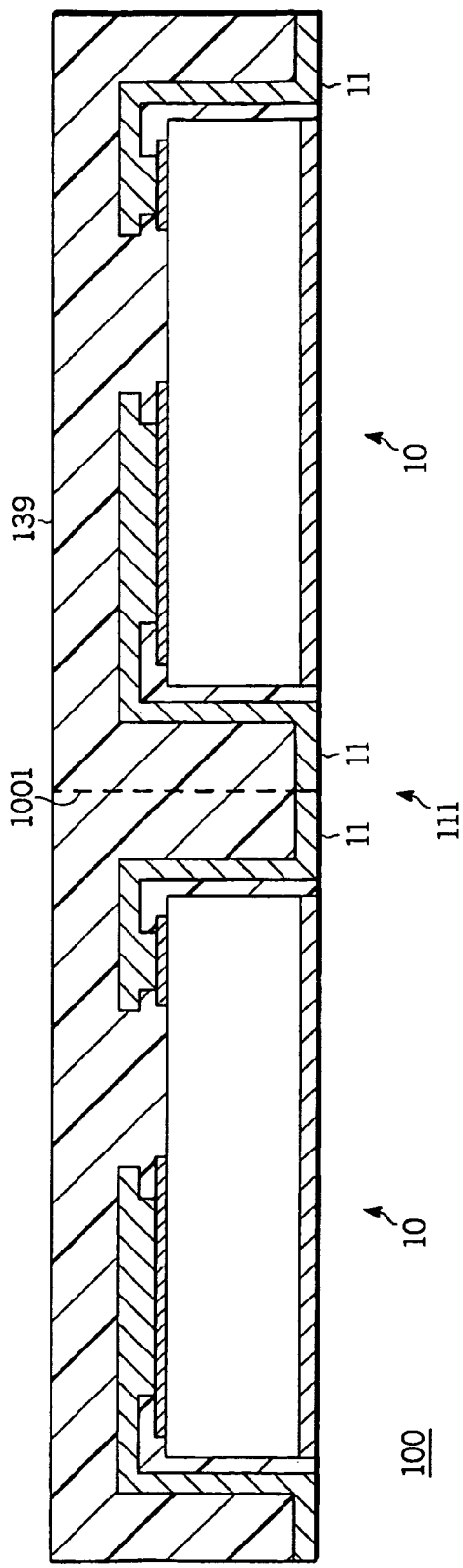
FIG. 2 illustrates a cross-sectional view of a plurality of the package structures of FIG. 1A manufactured using a preferred molding process in accordance with the present invention.

FIG. 2 shows a cross-sectional view of a plurality 100 of packages 10 of FIG. 1A according to a preferred overmolding manufacturing process for making package 10. Plurality 100 of packages 10 is formed using an array 111 of down-set lead frames 11 and an overmolding process. In the overmolding process, the array 111 of lead frames 11 is molded with a continuous layer 139 of mold compound, and a saw, dicing, or other separation technique is used to cut the molded structure into individual packages 10 along, for example, dashed line 1001. This approach is preferred compared to a single cavity molding process because it reduces the usage of mold compound materials, and reduces the amount of waste lead frame materials.

Figure 3:
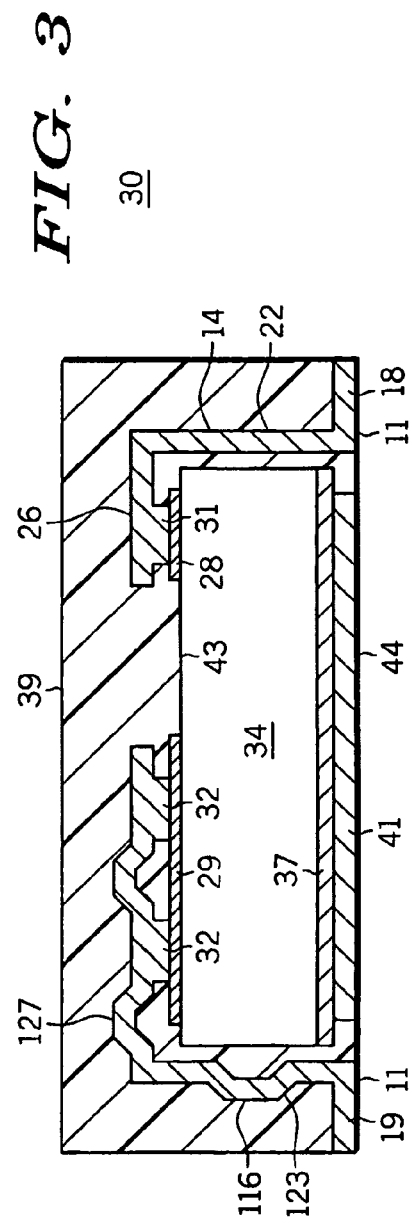
FIG. 3 illustrates a cross-sectional view of an alternative embodiment of a package structure in accordance with the present invention.

FIG. 3 shows an enlarged cross-sectional view of an alternative embodiment of a down-set package 30 in accordance with the present invention. In this embodiment, a conductive plug or plate 41 is attached to electrode 37, which is used to couple to a next level of assembly. In an exemplary embodiment, plate 41 comprises copper, a copper alloy, or materials similar to that used for lead frame 11. In addition, an undulating or non-planar down-set portion 116 is shown coupled to contact 29 of semiconductor chip 34, and with multiple stand-offs 32. In an exemplary embodiment, undulating down-set portion 116 includes an undulating middle portion 123 and an undulating base portion 127. Undulating down-set portion 116 is preferred in some applications because it places a portion of the down-set conductive lead close to the outside surface of package 30, which helps to enhance or improve the transfer or dissipation of heat generated by current carrying electrode 29. In an alternative embodiment, only the middle portion or the base portion of down-set portion 116 is undulated. It is understood that undulating down-set portion 116 and/or conductive plate 41 may be used with package 20 of FIG. 1B as well as the embodiments described hereinafter.

Figure 4:
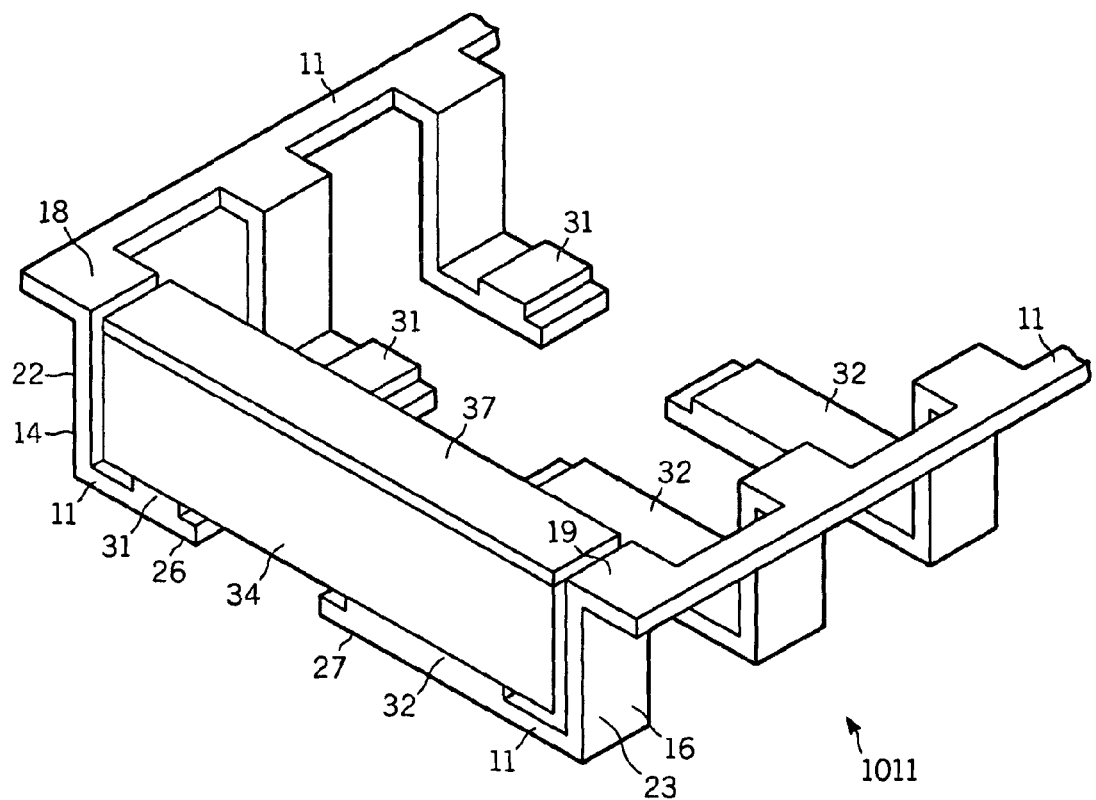
FIG. 4 illustrates a portion of a lead frame structure and chip in accordance with the package structures of FIGS. 1A and 1B.
Figure 5:
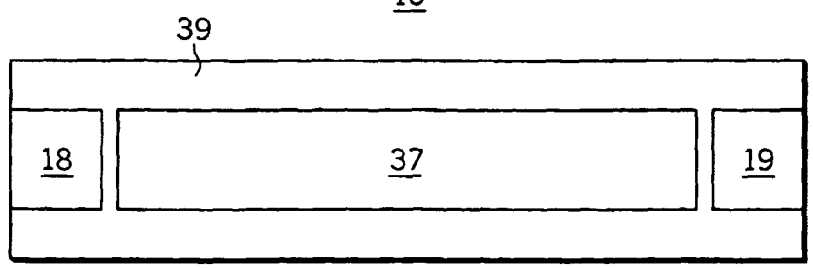
FIG. 5 illustrates a bottom view of the package structure of FIG. 1A incorporating the lead frame structure of FIG. 4.

FIG. 4 shows a portion of an array 1011 of down-set lead frames 11 according to the present invention after a first semiconductor chip 34 is attached, which is suitable for manufacturing packages 10 and 20. Semiconductor chip 34 is attached to stand-offs 31 and 32 using the materials described above. Although not shown, a second or an additional semiconductor chip 34 is attached to the second stand-offs 31 and 32 prior to an encapsulating step and/or separation step. FIG. 5 shows a bottom view of package 10 of FIG. 1A after optional encapsulation layer 39 is formed, and shows exposed portions of pad portions 18 and 19 as well as electrode 37. Alternatively, element 37 is replaced with a surface of plate 41 according to the embodiment shown in FIG. 3.

Figure 6:
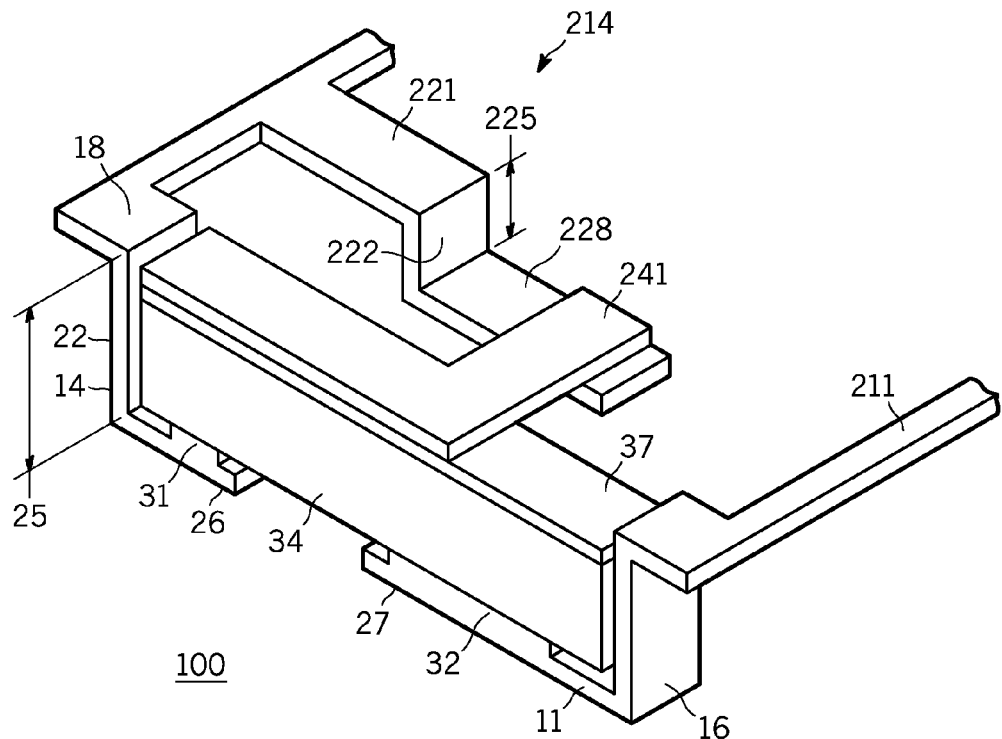
FIG. 6 illustrates a portion of an alternative lead frame structure and chip in accordance with the present invention.

FIG. 6 shows a portion of an alternative embodiment of a down-set package 100 including a lead frame 211, which includes down-set conductive leads 14 and 16. In this embodiment, lead frame 211 includes an additional down-set portion or conductive lead 214, which includes a foot or pad portion 221, a middle, connecting, or leg portion 222, and support, top, bond, plateau, base or chip connect portion 228. Also, leg portion 222 has a height or length 225 that is less than height or length 25 of leg portion 22, which allows for an attachment structure, a connective device, clip or strip 241 to be used to couple semiconductor chip 34 to base portion 228 as shown. Clip 241 is attached to semiconductor chip 34 and base portion 228 using, for example, solder die attach materials. Clip 241 comprises, for example, copper, a copper alioy, plated copper, or similar materials. In an alternative embodiment, heights 25 and 225 are the same, and o bent clip is used to couple semiconductor chip 34 to base portion 228.

Figure 7:
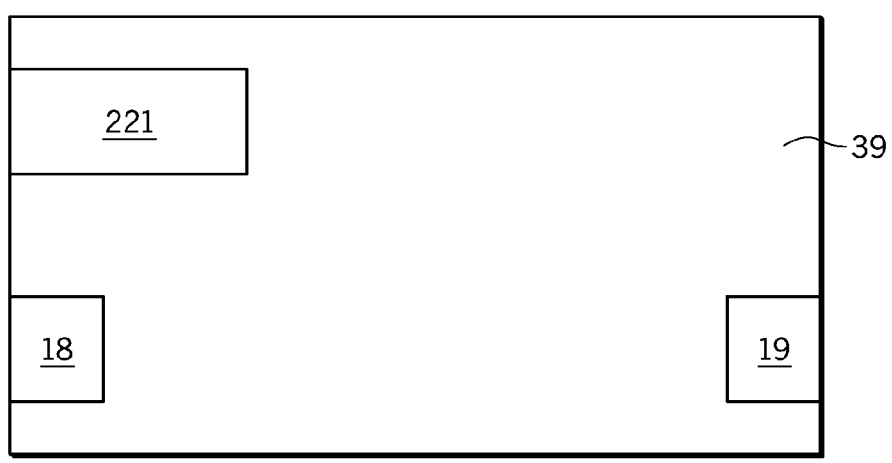
FIG. 7 illustrates a bottom view of a package structure incorporating the lead frame structure and chip of FIG. 6.

In the embodiment of FIG. 6, height 25 is greater than the combined thicknesses of stand-offs 31 and 32, semiconductor chip 34 and clip 241 so that after molding, encapsulation layer 39 covers clip 241. FIG. 7 shows a bottom view of a package structure 100A after optional encapsulation layer 39 is formed, and after a separation step. Foot portions 18, 19, and 221 of package 100A include exposed surfaces as shown for coupling to a next level of assembly. The embodiment of FIG. 6 is preferred if the planarity of electrode 37 is an issue.

Figure 8:
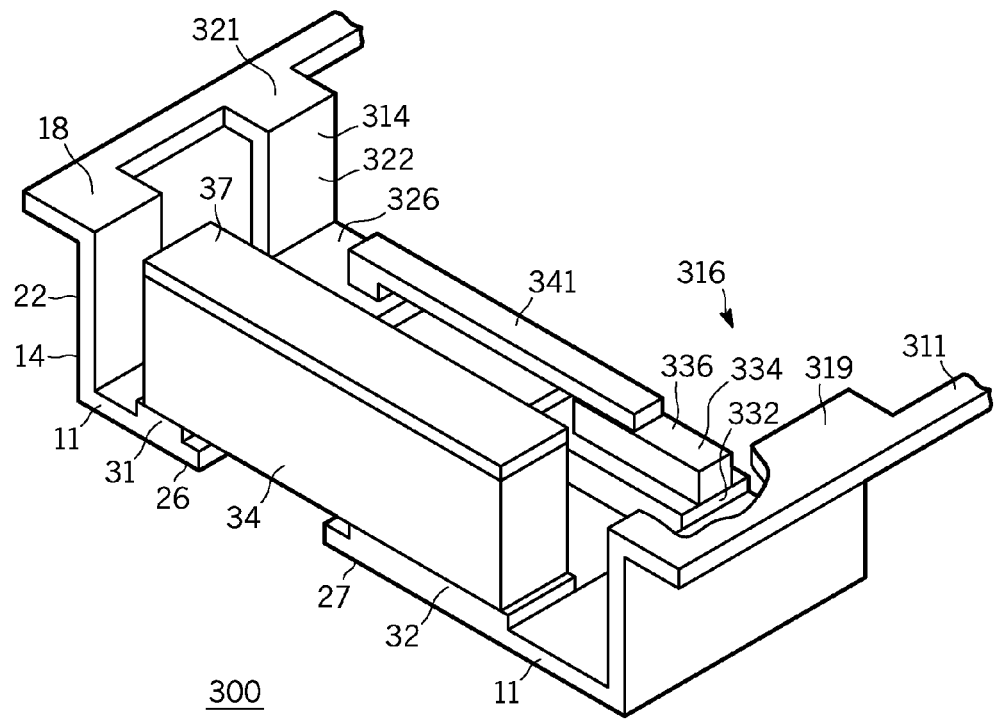
FIG. 8 illustrates a portion of a lead frame structure and chips for a multi-chip package structure in accordance with the present invention.

FIG. 8 shows a portion of a down-set multi-chip package 300 including a lead frame 311 according to the present invention. Lead frame 311 includes lead frame portion 11 and semiconductor chip 34 as shown in FIG. 4, with the exception of a common pad portion 319. Lead frame 311 further includes additional recessed or down-set portions or conductive leads 314 and 316 for supporting a same or different semiconductor chip 334. For example, semiconductor chip 334 comprises a diode, a sensor, a passive component, an integrated circuit, or the like. Down-set conductive lead 316 includes a stand-off 332, where semiconductor chip 334 is attached using, for example, a solder die attach layer. In this embodiment, down-set conductive lead 314 is partially down-set, or is raised above the other base portions as shown to accommodate a clip 341, which couples semiconductor chip 334 to base portion 326. Down-set conductive lead 314 further includes a foot or pad portion 321 for coupling to a next level of assembly. Leg portion 322 couples pad portion 321 to base portion 326. In an alternative embodiment, clip 341 is eliminated, and another, a lower or back side 336 of semiconductor chip 334 is exposed directly for coupling to a next level of assembly. It is understood that conductive plate 41 may be used with other embodiments described herein.

Figure 9:
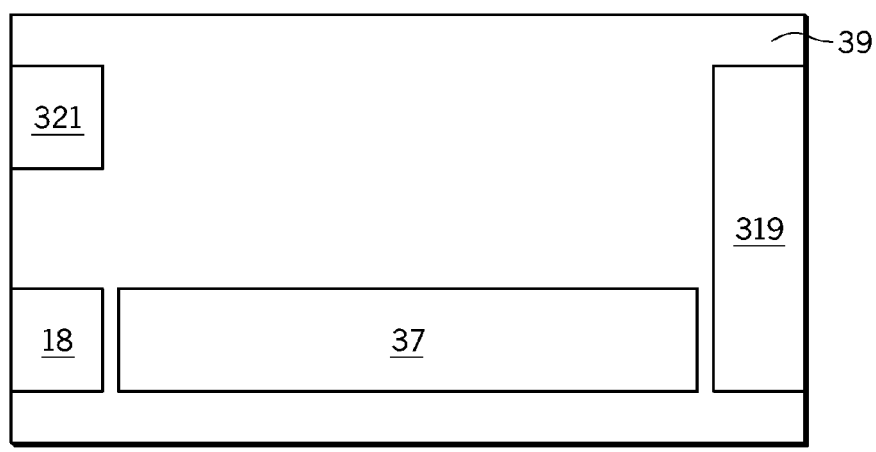
FIG. 9 illustrates a bottom view of a package structure incorporating the lead frame structure and chips of FIG. 8.

FIG. 9 is a bottom view of a down-set multi-chip package structure 300A after a molding step to form optional encapsulating layer 39, and after a separation step to show the package outline and an exemplary location of foot portions 18, 319, and 321, and electrode 37.

Figure 10:
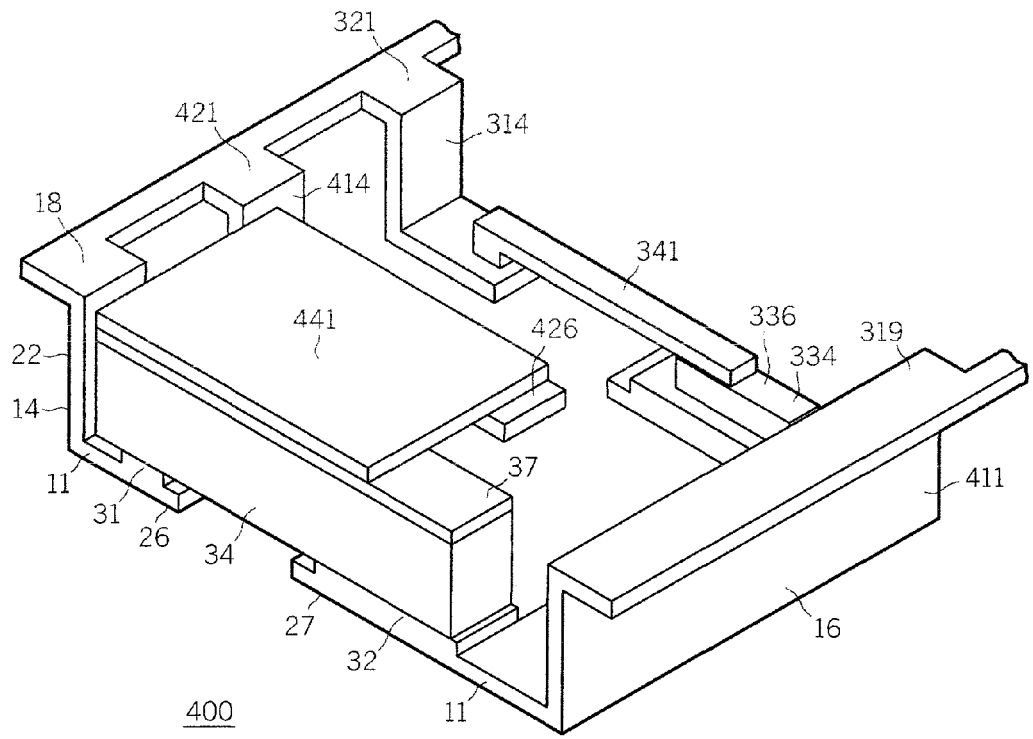
FIG. 10 illustrates a portion of an alternative lead frame structure and chips for a multi-chip package in accordance with the present invention.

FIG. 10 shows a portion of an alternative down-set multi-chip package 400 including lead frame 411 in accordance with the present invention. The embodiment of FIG. 10 is similar to FIG. 9 except that lead frame 411 includes an additional down-set conductive lead 414, which supports a conductive clip 441 that couples electrode 37 of semiconductor chip 34 to a base portion 426. This is similar to the embodiments described in conjunction with FIG. 6. In this embodiment, down-set conductive lead 414 is partially down-set, or is raised above the other base portions to accommodate clip 441. In an alternative embodiment, down-set conductive lead 414 is down-set to the same degree as the other down-set portions, and a bent clip is used to couple electrode 37 to down-set conductive lead 414. Down-set conductive lead 414 includes a foot or pad portion 421 for coupling to a next level of assembly.

Figure 11:
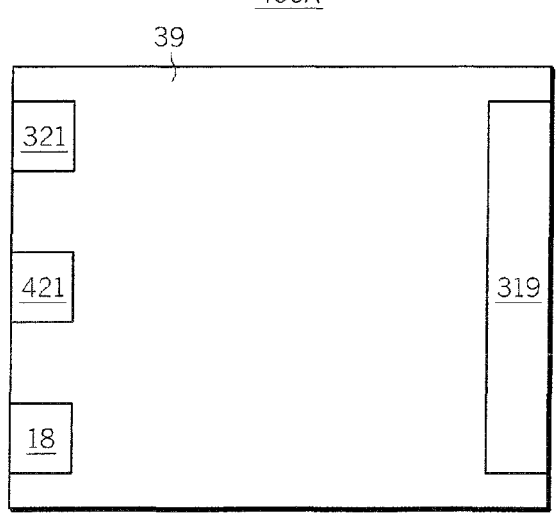
FIG. 11 illustrates a bottom view of a package structure incorporating the lead frame structure and chips of FIG. 10.

FIG. 11 is a bottom view of a down-set multi-chip package 400A after an optional molding step to form encapsulating layer 39, and after a separation step to show the package outline and an exemplary location of exposed surfaces of pad portions 18, 319, 321, and 421. It is understood that the sizes of pad portions 18, 19, 319, 321, and 421 as shown in FIGS. 5, 7, 9, and 11 are exemplary only, and the sizes are increased or decreased according to design and application constraints.

Figure 12:
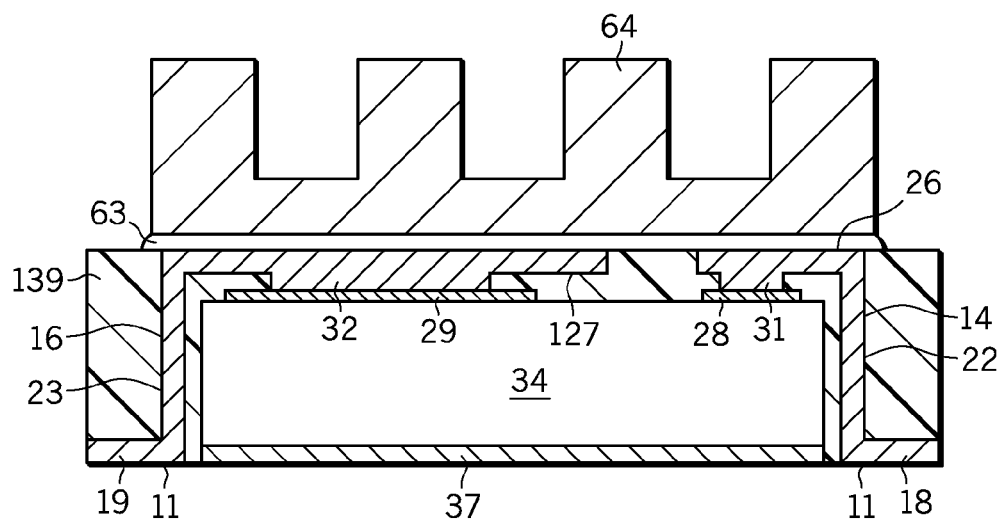
FIG. 12 illustrates a cross-sectional view of a package structure according to a further embodiment of the present invention.

FIG. 12 shows a cross-sectional view a down-set package structure 40 according to a further embodiment of the present invention. Package 40 is similar to packages 10, 30, 100A, 300A, and 400A except that encapsulating layer 139 is thinner to expose an upper, outer, or major surface of base portion 127. This is accomplished for example, by placing base portion 127 against a surface of a mold cavity during the molding process to prevent mold compound from covering base portion 127.

In the embodiment shown, an outer surface of base portion 26 is also exposed, but this is not required. By exposing the outer surface of base portion 127, heat dissipation is improved. Also, as shown in FIG. 12, base portion 127 is longer than base portion 27 to provide more surface area to dissipate heat. Optionally, a heat spreader 64 is attached directly to base portion 127 using a conductive epoxy. Alternatively, a thermally conductive and electrically insulative layer 63 is used to attach heat spreader 64 to package 40. It is understood that the embodiment of FIG. 12 is suitable for packages 10, 30, 100A, 300A, 400A, and combinations thereof.

Figure 13:
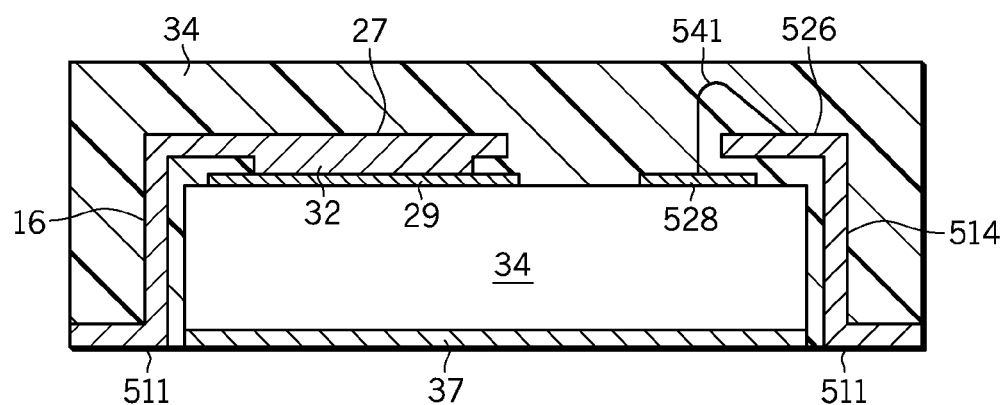
FIG. 13 illustrates a cross-sectional view of a package structure according to a still further embodiment of the present invention.

FIG. 13 shows a cross-sectional view of a down-set package structure 500 according to further embodiment of the present invention. Package structure is similar to package structure 10, 30, 100A, and 300A except that in this embodiment, lead frame 511 includes a down-set conductive lead 514 having a base or plateau portion 526 that is spaced apart from a contact 528 of semiconductor chip 34. That is, base portion 526 is formed without a stand-off. This allows the use of other connective devices, such as wire bond 541 to couple contact 528 to base portion 526. Wire bond 541 is formed using conventional wire bond techniques. In this embodiment, contact 528 comprises a conductive material suitable for wire bonding such as aluminum, an aluminum alloy, or the like. In an alternative embodiment, wire bond 541 is replaced with a ribbon bond or a clip. It is understood that the embodiment of FIG. 13 is suitable for package structures 10, 20, 30, 100A, 300A or combinations thereof.

Thus it is apparent that there has been provided, in accordance with the present invention, a structure and method for forming an improved electronic package. The package incorporates a down-set leadframe with a chip oriented so that its major current carrying electrode is coupled to stand-offs on the down-set leadframe. The stand-offs reduce chip rotation during solder die attach. In one embodiment, the chip includes a control electrode coupled to other stand-offs on the down-set leadframe. In a preferred embodiment, the current carrying electrode comprises a solderable metal. The stand-offs and solderable metal provide a more reliable and cost effective package structure compared to prior art devices utilizing flip chip and UBM interconnect schemes.

In another embodiment, a wire bond is used to couple the control electrode to the lead frame. In a further embodiment, the lead frame includes one down-set conductive lead that has an undulating profile to enhance thermal dissipation. In a still further embodiment, the encapsulating layer is thinned to provide exposed base portions, which improves heat dissipation. The structure according to the present invention is further suitable for multi-chip and multi-interconnect configurations. An overmolding process is used in a preferred method of forming the package of the present invention, which reduces the use of mold compound and the amount of lead frame waste.

Although the invention has been described and illustrated with reference to specific embodiments thereof, it is not intended that the invention be limited to these illustrative embodiments.

What is claimed is:

1. A package structure comprising:
    an electronic chip having a first bonding surface with a first electrode, and a second bonding surface opposite the first bonding surface, wherein the electronic chip is bumpless; and
    a first down-set conductive lead having a first base portion and a first stand-off, wherein the first stand-off is formed as part of the first base portion, and wherein the first stand-off has an attachment area that corresponds to the area of the first electrode, and wherein the attachment area is smaller than the first electrode, and wherein the first stand-off is connected to the first electrode.

2. The package of claim 1 further comprising an encapsulating layer covering at least a portion of the first down-set conductive lead and at least a portion of the electronic chip.

3. The package of claim 2, wherein a surface of the first base portion is exposed.

4. The package of claim 2 wherein the first down-set conductive lead includes a first pad portion, and wherein a portion of the first pad portion and the second bonding surface are exposed.

5. The package of claim 2 wherein the encapsulating layer comprises an overmolded encapsulating material.

6. The package of the claim 1 wherein the first electrode comprises a solderable metal.

7. The package of claim 1 wherein at least a portion of the first down-set conductive lead is undulating.

8. The package of claim 1 further comprising a conductive plate coupled to the second bonding surface.

9. The package of claim 1 further comprising a second down-set conductive lead, wherein the second down-set conductive lead includes a second stand-off and a second pad portion, and wherein the electronic chip further includes a second electrode on the first bonding surface, and wherein the second electrode is coupled to the second stand-off.

10. The package of claim 9 further comprising a third down-set conductive lead, wherein the second bonding surface is coupled to the third down-set conductive lead with an attachment structure.

11. The package of claim 10 wherein the attachment structure comprises a clip.

12. The package structure of claim 1 further comprising a second down-set conductive lead spaced apart from the electronic chip, and wherein a connective device couples the second down-set conductive lead to a second electrode on the electronic chip.

13. The package structure of claim 12 wherein the connective device comprises a wire bond.

14. An electronic package structure comprising:
    a first down-set conductive lead including a first pad portion and a first base portion having a first raised pedestal;
    a second down-set conductive lead including a second pad portion and a second base portion;
    a first electronic chip having first and second contacts on a first surface, wherein the first contact is coupled to the first raised pedestal, and wherein the electronic chip is bumpless;
    a first connective device coupling the second base portion to the second contact;
    a third down-set conductive lead including a third pad portion and a third base portion; and
    a second connective device coupling a second surface of the first electronic chip to the third base portion.

15. The electronic package structure of claim 14 further comprising an encapsulating layer covering at least a portion of the first down-set conductive lead and at least a portion of the first electronic chip.

16. The electronic package structure of claim 15 wherein a surface of the first base portion is exposed.

17. The electronic package structure of claim 14 wherein the first connective device comprises a second raised pedestal formed on the second base portion.

18. The electronic package structure of claim 14 wherein the first connective device comprises a wire bond.

19. The electronic package structure of claim 14 further comprising:
    a fourth down-set conductive lead including a fourth pad portion and a fourth base portion having a third raised pedestal;
    a fifth down-set conductive lead including a fifth pad portion and a fifth base portion;
    a second electronic chip having a third contact coupled to the third raised pedestal; and
    a second connective device coupling the second electronic chip to the fifth down-set conductive lead.

20. The electronic package structure of claim 14 wherein the second connective device comprises a clip.

21. The electronic package structure of claim 14 wherein a portion of the first down-set conductive lead is undulating.

* * * * *